(12) United States Patent
Bereza et al.

(10) Patent No.: US 8,130,044 B2
(45) Date of Patent: Mar. 6, 2012

(54) PHASE-LOCKED LOOP CIRCUITRY WITH MULTIPLE VOLTAGE-CONTROLLED OSCILLATORS

(75) Inventors: William W. Bereza, Nepean (CA); Rakesh H. Patel, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 513 days.

(21) Appl. No.: 12/142,746

(22) Filed: Jun. 19, 2008

(65) Prior Publication Data
US 2009/0315627 A1 Dec. 24, 2009

(51) Int. Cl.
*H03L 7/00* (2006.01)

(52) U.S. Cl. ............... 331/2; 331/36 C; 331/46; 331/48; 331/49; 331/56; 331/167

(58) Field of Classification Search ............ 331/2, 36 C, 331/46, 48, 49, 56, 167
See application file for complete search history.

(56) References Cited

U.S. PATENT DOCUMENTS

| | | | |
|---|---|---|---|
| 4,409,683 A * | 10/1983 | Woodward | 370/537 |
| 4,749,961 A | 6/1988 | Kato et al. | |
| 5,072,195 A | 12/1991 | Graham et al. | |
| 5,389,898 A | 2/1995 | Taketoshi et al. | |
| 5,563,554 A | 10/1996 | Mizuno | |
| 5,614,868 A | 3/1997 | Nielson | |
| 5,663,945 A | 9/1997 | Hayashi et al. | |
| 5,909,149 A | 6/1999 | Bath et al. | |
| 6,181,213 B1 | 1/2001 | Chang | |
| 6,252,209 B1 * | 6/2001 | Liepold | 219/501 |
| 6,339,357 B1 * | 1/2002 | Yamasaki et al. | 327/538 |
| 6,788,155 B2 * | 9/2004 | Chaudhuri et al. | 331/46 |
| 6,876,263 B1 * | 4/2005 | Li et al. | 331/49 |
| 7,020,444 B2 * | 3/2006 | Shinbo et al. | 455/76 |
| 7,319,356 B1 * | 1/2008 | Karim | 327/407 |
| 7,479,839 B1 * | 1/2009 | Kossel et al. | 331/177 V |
| 7,596,037 B2 * | 9/2009 | Sarin et al. | 365/189.09 |
| 7,679,457 B2 * | 3/2010 | Satoh et al. | 331/46 |
| 2002/0036345 A1 * | 3/2002 | Iseki et al. | 257/734 |
| 2005/0237117 A1 * | 10/2005 | Vu et al. | 331/2 |
| 2006/0181354 A1 * | 8/2006 | Kegasa et al. | 331/2 |
| 2007/0011482 A1 * | 1/2007 | Sai et al. | 713/500 |
| 2007/0030080 A1 * | 2/2007 | Han et al. | 331/18 |

* cited by examiner

*Primary Examiner* — Arnold Kinkead
*Assistant Examiner* — Richard Tan
(74) *Attorney, Agent, or Firm* — Treyz Law Group; G. Victor Treyz; David C. Kellogg

(57) ABSTRACT

Configurable phase-locked loop circuitry is provided. The phase-locked loop circuitry may include a buffer having a buffer output and a multiplexer having inputs and an output. The phase-locked loop circuitry may include multiple voltage-controlled oscillators. The phase-locked loop circuitry may be configured to switch a desired one of the voltage-controlled oscillators into use. Each voltage-controlled oscillator may be controlled by control signals applied to a control input for that voltage-controlled oscillator. The control input of each voltage-controlled oscillator may be connected to the buffer output. The output of each voltage-controlled oscillator may be connected to a respective one of the multiplexer inputs. Power-down transistors may be used to disable unused voltage-controlled oscillators to conserve power. The power-down transistors and the multiplexer may be controlled by signals from programmable elements. One or more of the voltage-controlled oscillators may be implemented using a separate integrated circuit connected using through-silicon vias.

23 Claims, 8 Drawing Sheets

PHASE-LOCKED LOOP CIRCUITRY WITH MULTIPLE VOLTAGE-CONTROLLED OSCILLATORS

BACKGROUND

This invention relates to integrated circuits, and more particularly, to circuitry on integrated circuits that allows one of several voltage-controlled oscillators to be selectively switched into use in a circuit such as a phase-locked loop.

Digital integrated circuits often contain analog circuitry. For example, some digital integrated circuits contain analog phase-locked loop circuitry. The analog phase-locked loop circuitry may be used as part of a clock and data recovery circuit or other circuit.

In certain types of circuits, such as programmable logic circuits, a logic designer may have the option of using the phase-locked loop circuitry for a variety of potential applications. For example, depending on the needs of the designer, the phase-locked loop circuitry may be used as part of a synchronous optical networking (SONET) transceiver or may be used as part of a Gigabit Ethernet transceiver. These circuits may have different operating requirements. For example, a SONET circuit may require very low phase noise, whereas this may not be a requirement of a Gigabit Ethernet, or other less stringent application-based circuit. Another example is where the VCOs may be called upon to provide different free-running frequencies.

Phase-locked loop circuits may contain voltage-controlled oscillators. There is generally a tradeoff between power consumption and phase noise in a voltage-controlled oscillator. Note that the power consumption associated with the VCO (voltage-controlled oscillator) in the context of a PLL (phase-locked loop) is generally a fixed quantity. As such, designing a PLL with stringent, low phase noise that consumes considerable power is then wasteful for applications where this phase noise stringency is not needed. Conversely, if the VCO is designed as a low-power device, it may not meet the phase noise demanded of it in more stringent applications. An example now follows.

When a transceiver such as a SONET transceiver requires a low phase noise, it may be necessary to use a design for a phase-locked loop and voltage-controlled oscillator for that transceiver that consumes a relatively large amount of power. When a transceiver such as a Gigabit Ethernet transceiver does not require the same low phase noise, however, power can be conserved by using a design for a phase-locked loop and voltage-controlled oscillator that consumes less power.

In order to minimize power consumption while meeting required performance levels, conventional integrated circuits sometimes use arrangements with multiple phase-locked loops, each with a corresponding optimized voltage-controlled oscillator. This type of arrangement may make it possible to operate the integrated circuit with an appropriately tailored phase-locked loop circuit, but leads to duplication and therefore consumes large amounts of circuit area.

It would therefore be desirable to provide improved ways in which to implement oscillator circuitry on an integrated circuit.

SUMMARY

In accordance with the present invention, configurable voltage-controlled oscillator circuits are provided. The configurable voltage-controlled oscillators circuits may be formed from multiple voltage-controlled oscillators connected in parallel. Switching circuitry may be used to switch a desired one of the voltage-controlled oscillators into use. This arrangement allows multiple voltage-controlled oscillators to be provided, each of which is optimized for a potentially different application (e.g., different frequency, noise level, power consumption level, etc.).

The configurable voltage-controlled oscillator circuitry may be used in any suitable circuitry. As an example, the configurable voltage-controlled oscillator circuitry may be used in a configurable phase-locked loop.

The phase-locked loop circuitry may include a buffer having a buffer output and a multiplexer having inputs and an output. The phase-locked loop circuitry may include multiple voltage-controlled oscillators connected in parallel. Each voltage-controlled oscillator may be controlled by control signals applied to a control input for that voltage-controlled oscillator. The control input of each voltage-controlled oscillator may be connected to the buffer output. The output of each voltage-controlled oscillator may be connected to a respective one of the multiplexer inputs. The multiplexer can be adjusted to connect a desired one of its inputs to its output, thereby selecting which voltage-controlled oscillator is used in operating the phase-locked loop.

Power-down transistors may be used to disable unused voltage-controlled oscillators to conserve power. The power-down transistors and the multiplexer may be controlled by static control signals from programmable elements.

One or more of the voltage-controlled oscillators may be implemented using a separate integrated circuit. The separate integrated circuit may be connected to the integrated circuit in which the rest of the phase-locked loop circuit has been implemented using through-chip vias also known as through-silicon vias (TSVs).

Further features of the invention, its nature and various advantages will be more apparent from the accompanying drawings and the following detailed description of the preferred embodiments.

DETAILED DESCRIPTION

The present invention relates to integrated circuits containing oscillator circuitry. The oscillator circuitry may be voltage-controlled oscillator circuitry in a phase-locked loop circuit or other suitable circuitry. The oscillator, phase-locked loop circuitry, and other suitable circuitry may be implemented on one or more integrated circuits. The integrated circuits may be, for example, memory chips, digital signal processing circuits, microprocessors, application specific integrated circuits, programmable logic device integrated circuits, analog-to-digital converter circuits, communications circuits, transceiver circuits, or any other suitable integrated circuits that may use voltage-controlled oscillators and phase-locked loops. The phase-locked loops, in turn, may be used in clock-and-data recovery circuits, clock synthesizer circuits, or any other suitable circuitry.

Figure 1:
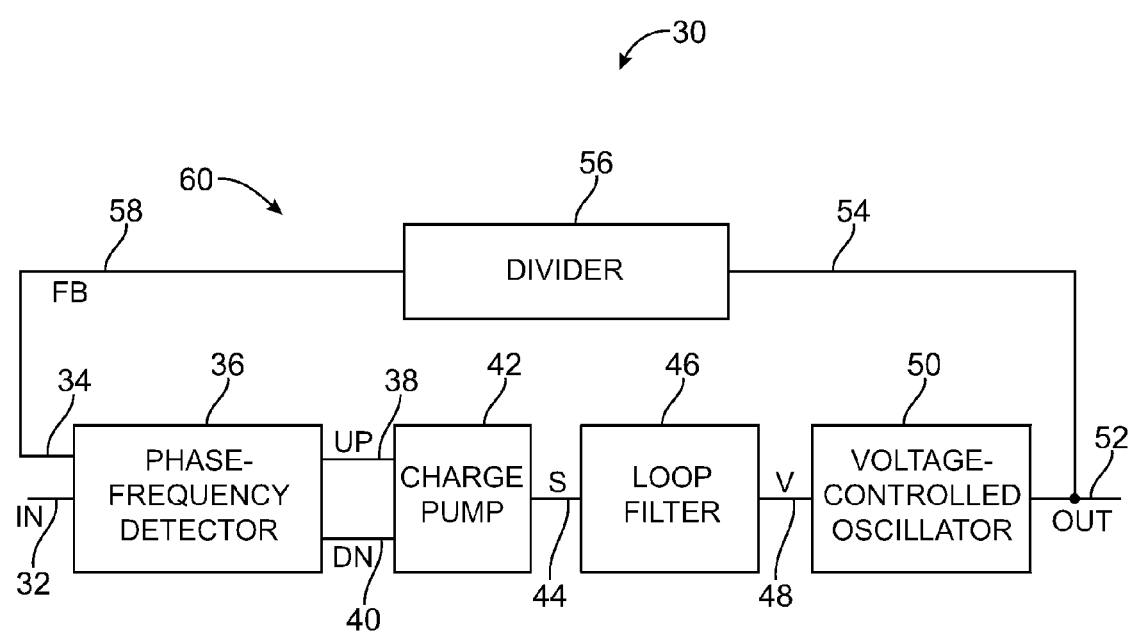
FIG. 1 is a diagram of a conventional phase-locked loop.

A conventional phase-locked loop circuit 30 is shown in FIG. 1. Phase-locked loop 30 includes phase-frequency detector 36, charge pump 42, loop filter 46, voltage-controlled oscillator 50, and frequency divider 56. In this example, phase-locked loop 30 is locking to an input signal IN such as a reference clock on line 32 and is providing a corresponding output signal OUT such as a recovered clock on line 52.

Phase-frequency detector 36 compares the input signal IN provided to input 32 to a feedback signal FB from feedback path 60 that is received at input 34. Phase-frequency detector 36 provides the error signals UP and DN on outputs 38 and 40. Signals UP and DN are digital signals that vary between logic high and logic low values. The logic high value is typically the core logic power positive power supply voltage (e.g., a Vdd value of 1.1 volts) and the logic low value is typically ground (e.g. a Vss value of 0 volts). When the signal IN is ahead of (i.e., early relative to) the signal FB, the control signals UP and DN have a first state. For example, UP may be high and DN may be low. When the signal IN is behind (i.e., late relative to) the signal FB, the control signals have a second state (i.e., UP may be low and DN may be high). The phase-frequency detector outputs UP and DN therefore act as control signals for the rest of the phase-locked loop. These control signals adjust the frequency of the feedback signal derived from the voltage-controlled oscillator 50 so that the frequency of the feedback signal FB matches the frequency of signal IN.

The output signals UP and DN from the phase-frequency detector 36 are provided to the inputs of charge pump 42. Charge pump 42 produces an analog output current S that is proportional to the incoming control signals UP and DN. Signal S is provided to loop filter 46 over path 44. Loop filter 46 filters the signal S to remove undesirable frequency components and provides a corresponding filtered voltage V to voltage-controlled oscillator 50 over line 48. Voltage-controlled oscillator 50 produces an output signal OUT whose frequency is proportional to the voltage V on line 48. The output signal from the voltage-controlled oscillator 50 may be fed back to input 34 of the phase-frequency detector 36 via feedback path 60. Feedback path 60 may include paths 54 and 58 and frequency divider 56. Frequency divider 56 may be used to establish a desired integer ratio between the frequency of output signal OUT and the frequency of input signal IN. For example, if it is desired to produce an output signal OUT at ten times the frequency of input signal IN, a divider 56 that performs division by ten may be included in feedback path 60.

Figure 2:
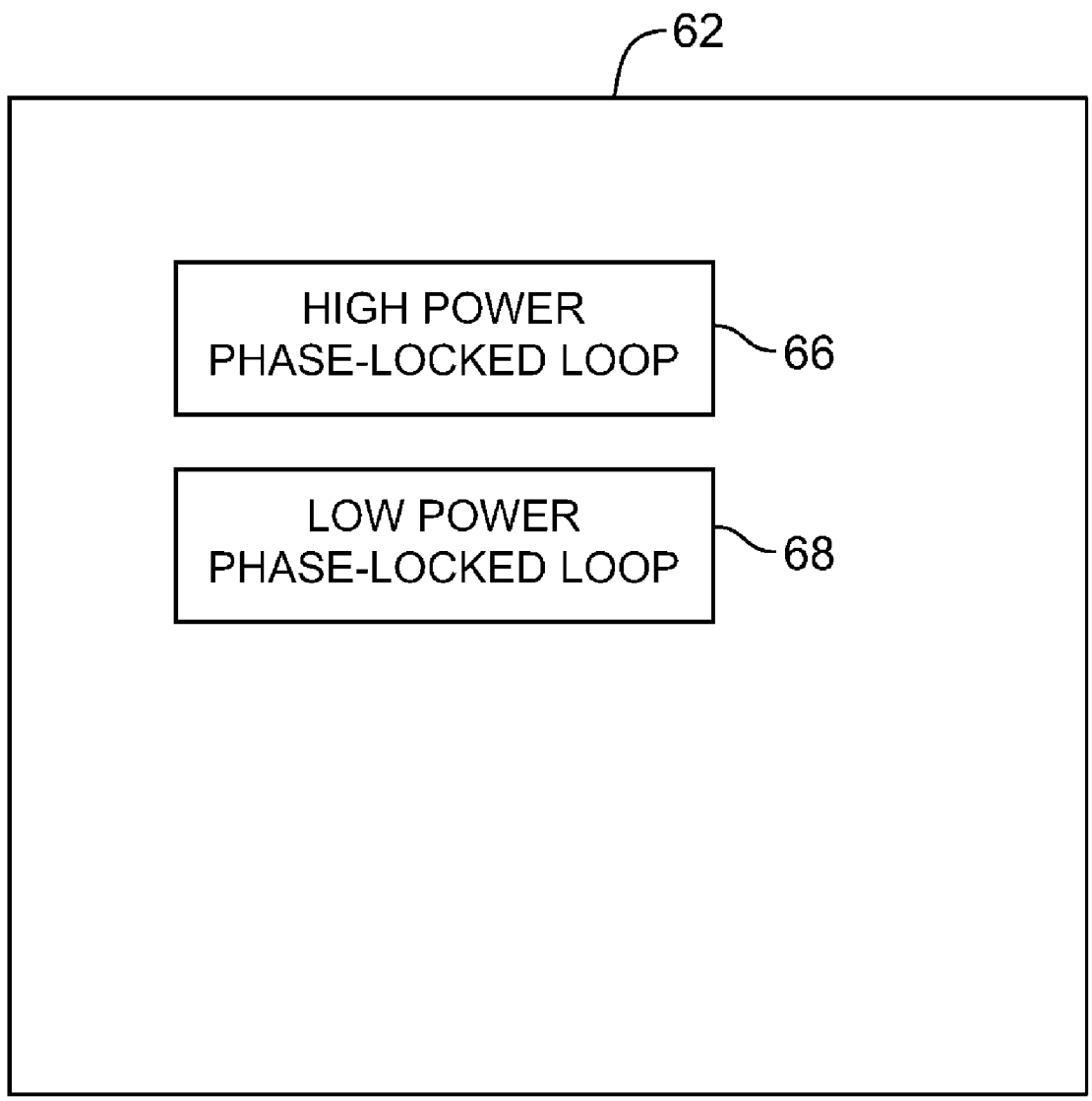
FIG. 2 is a diagram of a conventional integrated circuit containing multiple phase-locked loops.
Figure 3:
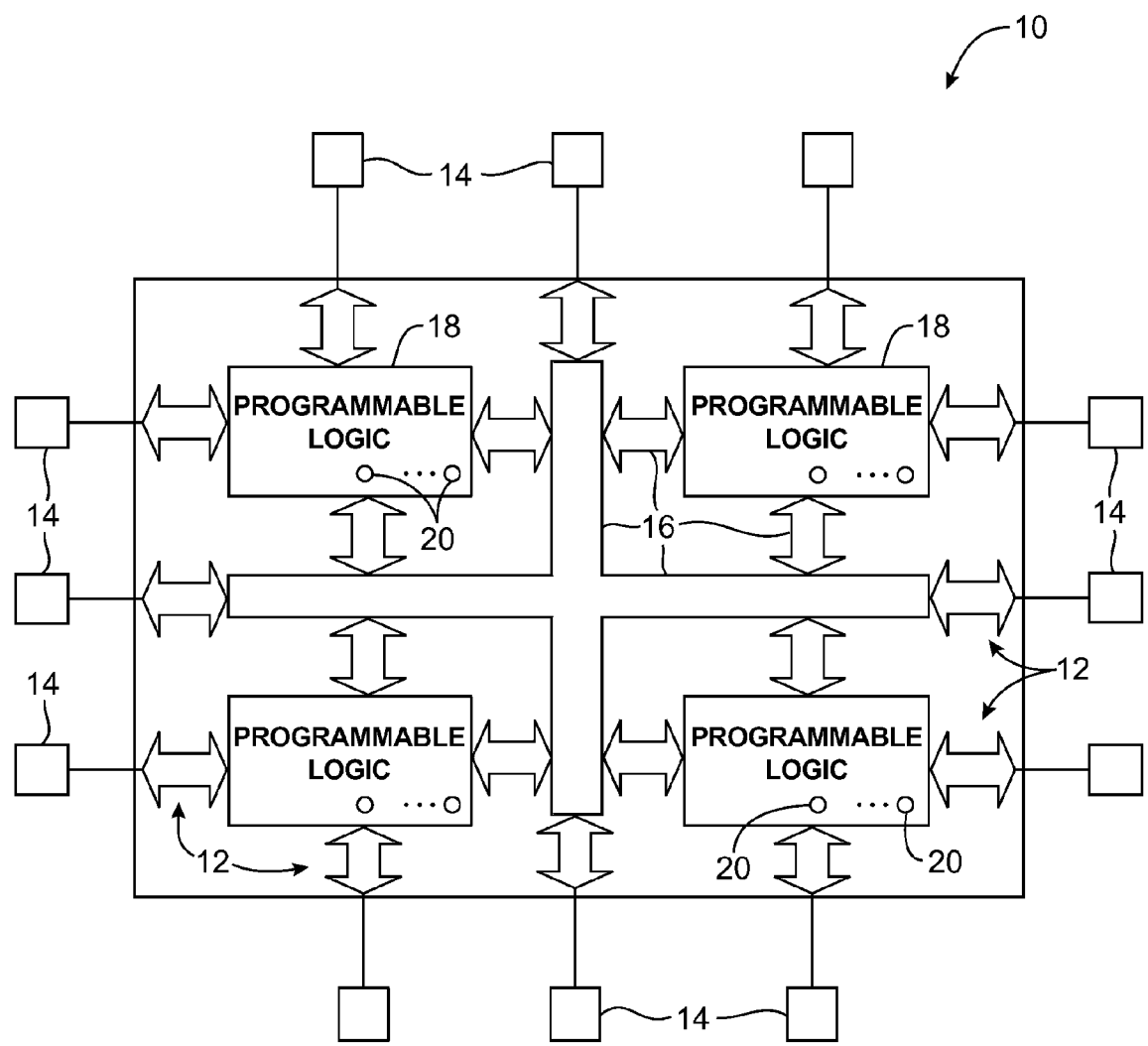
FIG. 3 is a diagram of an integrated circuit that may contain configurable voltage-controlled oscillator circuitry in accordance with an embodiment of the present invention.

To accommodate a variety of potential applications ranging, for example, from low-phase-noise SONET applications to low-power Gigabit Ethernet applications, conventional integrated circuits sometimes incorporate multiple phase-locked loop circuits. This type of arrangement is shown in FIG. 2. As shown in FIG. 2, integrated circuit 62 may have a first phase-locked loop circuit such as phase-locked loop 66 and a second phase-locked loop such as phase-locked loop 68. Each phase locked loop may be optimized for operation in a different application. For example, phase-locked loop 66 (which may consume a relatively large amount of power during operation) may be designed to handle SONET signals, whereas phase-locked loop 68 (which may consume a relatively small amount of power during operation) may be designed to handle Gigabit Ethernet signals. When it is desired to perform SONET operations, phase-locked loop 66 may be powered on and switched into use. When it is desired to perform Gigabit Ethernet operations, phase-locked loop 66 may be turned off and phase-locked loop 68 may be turned on. Because phase-locked loop 68 consumes less power than phase-locked loop 66 (in this example), the use of phase-locked loop 68 in place of phase-locked loop 66 when the low phase noise properties of loop 66 are not required can reduce power consumption for integrated circuit 62.

Conventional arrangements of the type shown in FIG. 2 may operate satisfactorily in a variety of conditions. However, the need to provide multiple independent phase-locked loop circuits on a given integrated circuit can be wasteful, as this type of approach tends to consume relatively large amounts of circuit chip area.

In accordance with the present invention, overall resource consumption may be minimized while supporting multiple phase-locked loop designs by providing a configurable phase-locked loop circuit. The configurable phase-locked loop circuit may have multiple individualized voltage-controlled oscillator sections that share a common front end. When it is desired to support operations with a particular requirement (e.g., low phase noise, different center, i.e., free-running frequencies, etc.), the voltage-controlled oscillator that is tailored to that type of requirement may be switched into use in the phase-locked loop. When it is desired to support operations with a different set of requirements, a different one of the voltage-controlled oscillators may be switched into use in the phase-locked loop. Programmable logic such as a programmable multiplexer circuit may be used in switching the desired voltage-controlled oscillator into use.

The programmable logic and other circuitry for the phase-locked loop may be implemented on any suitable integrated circuit. With one illustrative arrangement, which is described herein as an example, the programmable logic and other circuitry may be implemented as part of a programmable integrated circuit such as programmable logic device integrated circuit.

An illustrative circuit 10 that contains programmable logic is shown in FIG. 1. Circuit 10 may be, for example, a programmable logic device. Programmable logic device 10 may have input-output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 may include fixed interconnects (conductive lines) and programmable interconnects (i.e., programmable connections between respective fixed interconnects).

Programmable logic 18 may include combinational and sequential logic circuitry. The programmable logic 18 may be configured to perform a custom logic function. The programmable interconnects associated with interconnection resources 16 may be considered to be a part of programmable logic 18.

Programmable logic device 10 contains programmable elements 20. Programmable elements 20 may be based on any suitable technology. For example, programmable elements may be formed from mask-programmable via structures on device 10. With this type of arrangement, the programmable logic of device 10 is configured using custom lithographic masks during fabrication. As another example, programmable elements 20 may be formed from volatile memory elements such as registers or random-access memory (RAM) cells. Programmable elements 20 can also be formed from nonvolatile memory elements such as fuses, antifuses, electrically-programmable read-only memory elements, etc.

Programmable elements 20 may be loaded with configuration data (also called programming data) using pins 14 and input/output circuitry 12. Once loaded, the programmable elements may each provide a corresponding static control output signal that controls the state of an associated logic component in programmable logic 18. The programmable element output signals are typically applied to the gates of metal-oxide-semiconductor (MOS) transistors. These transistors may include n-channel metal-oxide-semiconductor (NMOS) transistors and p-channel metal-oxide-semiconductor (PMOS) transistors in programmable components such as multiplexers (as an example).

The programmable element output signals turn the transistors to which they are connected on and off and thereby configure programmable logic 18 to perform its desired logic function. When a programmable element supplies a high output to an NMOS transistor (as an example), the transistor is turned on and passes logic signals from its input to its output. When the memory element output is low, the transistor is turned off and does not pass logic signals. Being able to configure transistors in this way allows the logic of the programmable logic device to be programmed to implement a desired logic design.

Because programmable elements 20 may store configuration data that is used in configuring programmable logic, the programmable elements are sometimes referred to as configuration random-access-memory (CRAM) cells. Other terms that are sometimes used to refer to programmable elements 20 include terms such as memory cells, static random-access-memory elements or cells, RAM cells, RAM elements, CRAM cells, configuration elements, volatile memory elements, non-volatile memory elements, configuration bits, etc. There may be any suitable number of programmable elements 20 on device 10 (e.g., tens of elements, hundreds of elements, thousands of elements, millions of elements, etc.).

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

The programmable elements 20 in logic 18 may be loaded from any suitable source. In a typical arrangement, the programmable elements are loaded from an external control chip called a configuration device via pins 14 and input-output circuitry 12. The configuration device may contain erasable-programmable read-only memory that stores the configuration data prior to loading or may obtain the configuration data from a separate source (e.g., an erasable-programmable read-only memory chip).

Figure 4:
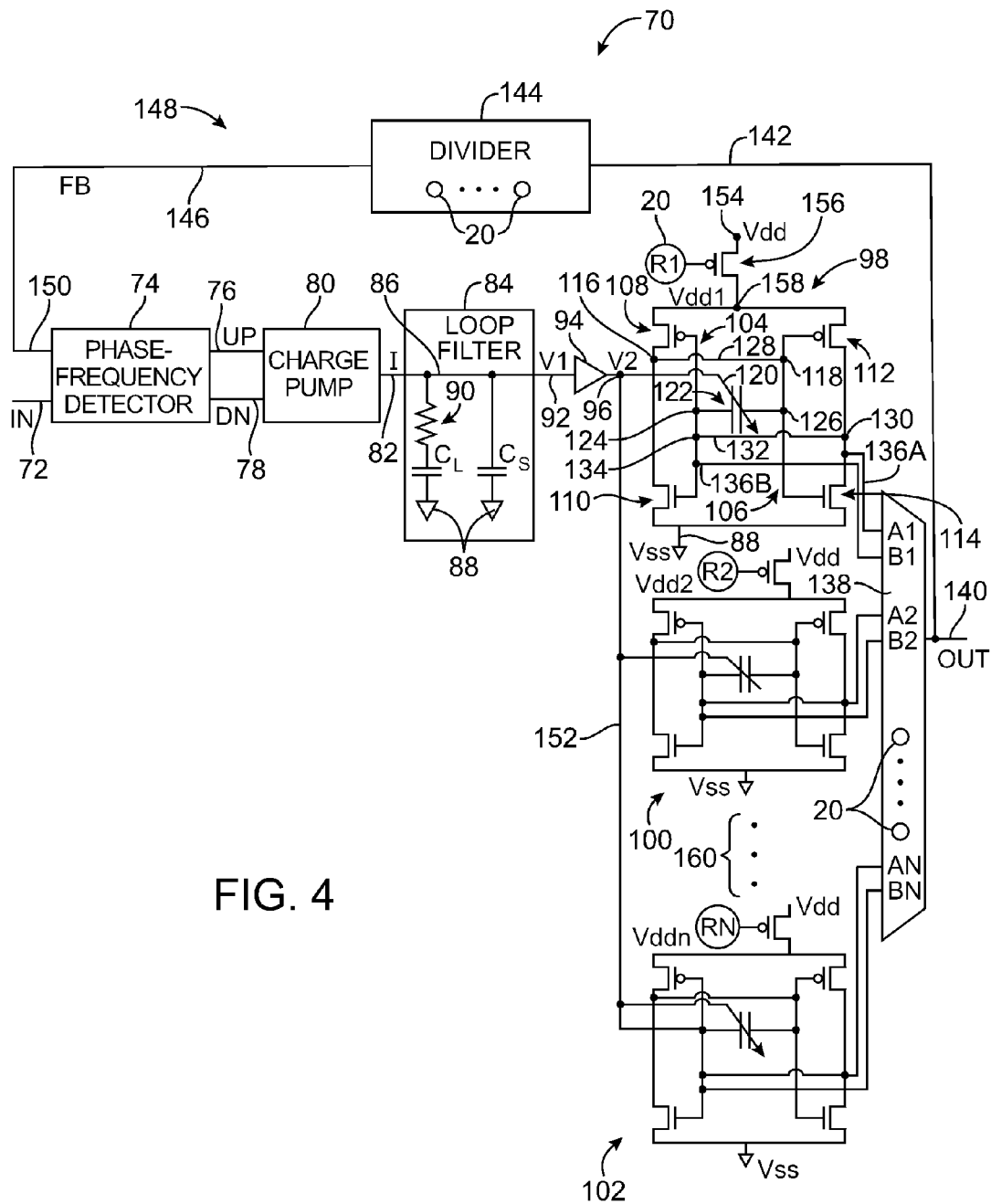
FIG. 4 is a diagram of a phase-locked loop containing configurable voltage-controlled oscillator circuitry in accordance with an embodiment of the present invention.

Adjustable phase-locked loop circuitry with selectable voltage-controlled oscillators may be implemented on integrated circuits such as programmable logic device 10. An illustrative phase-locked loop circuit with multiple voltage-controlled oscillators is shown in FIG. 4. As shown in FIG. 4, phase-locked loop 70 may include phase-frequency detector 74, charge pump 80, loop filter 84, and an optional frequency divider 144. There may be multiple voltage-controlled oscillators interposed in the loop between loop filter 84 and divider 144 such as voltage-controlled oscillators 98, 100, and 102. For example, there may be two, three, four, or more than four voltage-controlled oscillators in phase-locked loop 70.

A buffer such as buffer 94 may be interposed between the output of loop filter 84 and the inputs of voltage-controlled oscillators 98, 100, and 102. Switching circuitry such as multiplexer 138 may be adjusted to select which of the voltage-controlled oscillators 98, 100, and 102 is to be used as the active voltage-controlled oscillator for phase-locked loop 70. The remaining voltage-controlled oscillators may, if desired, be powered down to conserve power.

In the example of FIG. 4, phase-locked loop 70 is being used to lock to an input signal IN such as a reference clock on line 72. Phase-locked loop 70 provides a corresponding output signal OUT such as a recovered clock on output line 140.

Phase-frequency detector 74 compares the input signal IN that is provided to input 72 of phase-frequency detector 74 to feedback signal FB from feedback path 148 at input 150. Based on this comparison, phase-frequency detector 74 generates error signals on an output path. For example, phase-frequency detector 74 may provide error signals UP and DN on outputs 76 and 78. Signals UP and DN may be provided in the form of digital signals of varying lengths. The signals UP and DN may be digital signals that vary between a logic high value (e.g., a Vdd value of 1.1 volts or other suitable positive voltage) and a logic low value (e.g., a ground voltage Vss at 0 volts). When the signal IN is ahead of the signal FB, the control signals UP and DN may have a first state (i.e., UP may be high and DN may be low). When the signal IN is behind the signal FB, the control signals may have a second state (i.e., UP may be low and DN may be high).

The phase-frequency detector outputs UP and DN may therefore serve as control signals for phase-locked loop circuit 70. These control signals adjust the frequency of the feedback signal FB that is derived from the selected voltage-controlled oscillator. This ensures that the frequency of the feedback signal FB is locked to the frequency of signal IN.

The output signals UP and DN that are produced by phase-frequency detector 74 may be provided to the inputs of charge pump 80. In response to the signals UP and DN, charge pump 80 may produce an analog output signal I. The signal I may be, for example, a current having a magnitude that is responsive to the values of the incoming control signals UP and DN. For example, when UP is high and DN is low, the magnitude of I may rise, whereas the magnitude of I may fall when UP is low and DN is high.

The signal I on path 82 may be received at the input of loop filter 84. Loop filter 84 may include circuitry that filters the signal I. With one suitable arrangement, which is illustrated in FIG. 4, loop filter 84 may include an RC filter formed from series-connected resistor 90 and capacitor $C_L$. In this type of arrangement, resistor 90 and capacitor $C_L$ may be connected in series between internal loop filter path 86 and ground 88. Loop filter path 86 may receive signal I from path 82. Resistor

90 and capacitor $C_L$ may remove undesirable frequency components from signal I and may convert signal I to a voltage signal V1 on output path 92.

The capacitance of $C_L$ and the resistance of resistor 90 may be selected to provide filtering at suitable frequencies. The value of the $C_L$ capacitance may be, for example, on the order of hundreds of pF (as an example). The value of the resistance of resistor 90 may be on the order of kilohms (as an example). Capacitor $C_L$ may be formed from a metal-insulator-metal structure, a metal-oxide-semiconductor (MOS) structure, or any other suitable structure. Resistor 90 may be formed from a metal-oxide-semiconductor transistor structure, a polysilicon resistor structure, or any other suitable structure.

As shown in FIG. 4, loop filters such as loop filter 84 may have a shunt capacitance $C_S$. Capacitance $C_S$ may be connected in series between internal loop filter path 86 and ground 88 and may help to control ripple in the signal V1. The magnitude of capacitance $C_S$ is typically less than the magnitude of capacitance $C_L$. For example, capacitance $C_S$ may be about one hundred times smaller than $C_L$. Capacitance $C_S$ may be formed by a metal-insulator-metal capacitor or metal-oxide-semiconductor capacitor that is contained within loop filter 84 or may represent a parasitic shunt capacitance value that is associated with loop filter 84.

Voltage-controlled oscillators 98, 100, and 102 may oscillate at frequencies that are determined by adjustable capacitors (sometimes called varactors). For example, the frequency at which voltage-controlled oscillator 98 oscillates may be controlled by controlling the capacitance exhibited by capacitor 122. Proper operation of loop filter 84 requires that capacitance $C_S$ not be overwhelmed by the additional capacitive loading associated with voltage-controlled oscillators 98, 100, and 102. If the capacitance on line 86 were to become too large, the dynamics of the operation of loop 70 would be Accordingly, buffer 94 is preferably interposed between path 92 and voltage-controlled oscillators 98, 100, and 102. Buffer 94 prevents the collective capacitances of adjustable capacitors such as capacitor 122 of voltage-controlled oscillator 98 and the corresponding adjustable capacitors of oscillators 100 and 102 from increasing the total shunt capacitance on path 86 excessively.

Buffer 94 may be, for example, a differential-pair-based isolation follower. Buffers such as these may have intrinsically wide bandwidths, generally wider than the loop bandwidth of the closed-loop PLL. Accordingly, the use of differential-pair-based isolation follower for buffer 94 may avoid adverse impacts on the bandwidth of phase-locked loop 70.

Buffer 94 may receive control signal V1 on input 92 and may provide a corresponding control signal V2 its output. Buffer 94 may have a unity gain, a gain that is greater than unity, or a gain that is less than unity (e.g., when buffer 94 serves as an attenuator). In a typical configuration, buffer 94 is configured as a unit gain buffer, so that the magnitude of control signal V2 is the same as the magnitude of control signal V1.

The signal V2 is provided from the output of buffer 94 to node 96. A path such as path 152 may be used to distribute the signal V2 to multiple voltage-controlled oscillators in parallel. Each voltage-controlled oscillator may have a respective control input that receives the signal V2 and may have an output at which a corresponding output signal is provided. Output signals may be provided as single-ended signals (i.e., signals that are referenced to ground) or as differential signals (i.e., signals that are referenced to each other). In the FIG. 4 example, each voltage-controlled oscillator provides an output on a pair of associated differential output lines. For example, output lines 136A and 136B may be used to convey the output of voltage-controlled oscillator 98 to the A1 and B1 differential input of multiplexer 138. Similarly, inputs A2 and B2 may be used to receive the output of voltage-controlled oscillator 100 and inputs AN and BN may be used to receive the output of voltage-controlled oscillator 102. As indicated by dots 160, there may be any suitable number of voltage-controlled oscillator blocks in phase-locked loop 70, each of which receives control signal V2 at its input via path 152 and each of which provides a corresponding output signal to one of the inputs of multiplexer 138.

Multiplexer 138 may be controlled by static control signals (e.g., signals at the outputs of programmable elements 20 or signals derived from the outputs of programmable elements 20), by dynamic control signals (e.g., control signals that are received in real time from internal control logic or an external control circuit), or by both static and dynamic control signals. In a typical arrangement, configuration data is loaded into programmable elements 20 in device 10 that configures multiplexer 138 to connect a desired one of its inputs to its output 140. This configuration operation may be performed so as to satisfy performance constraints imposed by a logic designer.

Each voltage-controlled oscillator in phase-locked loop 70 is preferably optimized for a different application. For example, voltage-controlled oscillator 98 may be optimized to handle SONET signals using a low-phase-noise high power-consumption architecture, whereas voltage-controlled oscillator 100 may be optimized to handle Gigabit Ethernet signals using a more power-efficient design. One or more additional voltage-controlled oscillators such as voltage-controlled oscillator 102 may be designed to handle yet further signals. In general, each voltage-controlled oscillator may be optimized for operation in a different frequency, over a different range of frequencies, and over a different range of power consumption levels. Because there are multiple choices for a logic designer or other user of phase-locked loop 70, the logic designer is able to meet performance specifications while minimizing power consumption by proper selection of the voltage-controlled oscillator. If desired, the settings of phase-locked loop 70 may be adjusted in real time (e.g., after the integrated circuit in which phase-locked loop 70 is being used has been installed in a system).

The frequency of oscillation of each voltage-controlled oscillator may be controlled by a respective adjustable capacitor. For example, the frequency of operation of voltage-controlled oscillator 98 may be adjusted by adjusting the capacitance of capacitor 122. The adjustable capacitors in the voltage-controlled oscillators may be implemented using any suitable technology. For example, an adjustable capacitor may be implemented using a metal-oxide-semiconductor transistor structure in which the body, source, and drains have been connected to form a first electrode and in which the gate terminal forms a second electrode. Adjustable capacitors based on p-n junctions or other suitable structures may also be used.

Each adjustable capacitor may have a control input that receives the control voltage V2 from node 96. For example, adjustable capacitor 122 of voltage-controlled oscillator 98 may have a control input such as control input 120. Control input 120 may be electrically connected to node 96 and may receive control voltage V2. The capacitance of capacitor 122 may be adjusted by controlling the magnitude of the control voltage V2 on path 120. The capacitance of capacitor 122 may decrease as the control voltage V2 increases or, if desired, a capacitor structure may be used in which the capacitance of capacitor 122 increases with increases in voltage V2. Adjustable capacitors such as capacitor 122 are sometimes referred to as varactors.

Regardless of the type of adjustable capacitor that is used for capacitor 122, the capacitance of capacitor 122 may be adjusted by the signal V2 in real time to adjust the operation of phase-locked loop 70. As shown in FIG. 4, each voltage-controlled oscillator may have inverters that are connected in a ring to form a ring oscillator. There may, in general, be any suitable number of inverters connected in the ring (e.g., two inverters, three inverters, more than three inverters, etc.). The inverters may be single-ended inverters or differential inverters.

Adjustable capacitors such as capacitor 122 may be used as a variable delay-controlling element that controls the frequency of oscillation of the ring. As shown in the FIG. 4 arrangement, one or more capacitors such as capacitor 122 may be coupled to the inputs of the inverters in the ring (as an example).

In particular, FIG. 4 shows how voltage-controlled-oscillator 98 includes a first inverter 104 and a second inverter 106. Inverter 104 may be formed from p-channel metal-oxide-semiconductor transistor 108 and n-channel metal-oxide semiconductor transistor 110. Inverter 106 may be formed from p-channel metal-oxide-semiconductor transistor 112 and n-channel metal-oxide-semiconductor transistor 114. Transistors 108 and 110 may be connected in series between positive power supply node 158 (at voltage Vdd1) and ground terminal 88. Similarly, transistors 112 and 114 may be connected in series between positive power supply terminal 158 and ground 88.

Each inverter has an input and an output. For example, inverter 104 has input 124 and output 116. Inverter 106 has input 126 and output 130. Inverters 104 and 106 are connected in a ring by connecting output 116 of inverter 104 to input 126 of inverter 106 via path 128 and node 118 of inverter 106 and by connecting output 130 of inverter 106 to input 124 of inverter 104 via path 132 and node 134 of inverter 104.

Adjustable capacitor 122 may be connected between input nodes 124 and 126 by connecting one terminal of capacitor 122 to node 126 and the other terminal of capacitor 122 to node 124. The control input of capacitor 122 is connected to node 96 via control input path 120. As the capacitance of capacitor 122 is varied, the frequency of oscillation of the ring oscillator formed by inverters 104 and 106 is adjusted accordingly.

The output signals from each voltage-controlled oscillator may be routed to a respective input of multiplexer 138. For example, the output of voltage-controlled oscillator 98 may be connected to input terminals A1 and B1 of multiplexer 138 using the differential path that is made up of lines 136A and 136B. Multiplexer 138 may be adjusted so that a selected one of its inputs is connected to its output 140. For example, when it is desired to switch voltage-controlled oscillator 98 into use, rather than voltage-controlled oscillators 100 and 102, multiplexer 138 may be adjusted so that the input signals associated with differential input terminals A1 and B1 are routed to output 140. Paths 142 and 146 and optional divider 144 in feedback path 148 may be used to feed back the signal from voltage-controlled oscillator 98 to input 150 of phase-frequency detector 74. Divider 144 may be used to adjust the ratio of the frequency of input signal IN to output signal OUT. Divider 144 may perform division by an integer N. The value of N (e.g., 1, 2, 3, etc.) may be adjusted by dynamic control signals or by static control signals from programmable elements 20.

When a given voltage-controlled oscillator in phase-locked loop circuit 70 is not being used, it may be desirable to power down that oscillator to conserve power. If, for example, phase-locked loop circuit 70 contains four different voltage-controlled oscillators, three of the four oscillators may be shut down at any given time while the one voltage-controlled oscillator that is active may be powered up.

Any suitable circuitry may be used to power down unused voltage-controlled oscillator circuitry in phase-locked loop circuit 70. In the example of FIG. 4, p-channel metal-oxide-semiconductor power-down transistors are used to selectively power the active voltage-controlled oscillator while powering down unused oscillators. There may be a separate power-down transistor associated with each voltage-controlled oscillator. For example, as shown in FIG. 4, power for voltage-controlled oscillator 98 may be controlled by power-down transistor 156. Transistor 156 may have one source-drain terminal connected to power supply terminal 154. Power supply terminal 154 may receive power Vdd (e.g., a positive power supply voltage of 0.9-1.2 volts). Transistor 156 may have a second source-drain terminal connected to positive power supply node 158. The gate of transistor 156 may receive a control signal. The control signal may be supplied from a dynamic control circuit or may be supplied in the form of a static control signal from a programmable element 20, as shown in FIG. 4.

When the gate of transistor 156 receives a logic low control signal (e.g., Vss), transistor 156 is turned on and the power supply voltage Vdd1 for voltage-controlled oscillator 98 is taken high to Vdd. In this situation, voltage-controlled oscillator 98 is powered and active. When the gate of transistor 156 receives a logic high control signal (e.g., Vdd), transistor 156 will be turned off. With transistor 156 off, power supply rail Vdd1 will be disconnected from power supply source Vdd at node 154. This will power down voltage-controlled oscillator 98 and render it inactive to conserve power.

The power supply voltage Vdd2 for voltage-controlled oscillator 100 and the power supply voltage Vddn for voltage-controlled oscillator 102 may be controlled in the same way using respective power-down transistors. During operation of phase-locked loop 70, the pattern of control bits that are used to control the power-down transistors may be used to turn a given one of the voltage-controlled oscillators on so that it receives the control signal V2 from node 96 and produces an output signal for multiplexer 138 on its outputs, while powering down the remaining voltage-controlled oscillators. The control signals in the FIG. 4 example are produced by control bits R1, R2, . . . , RN from programmable elements 20, but in general the control signals for the gates of the power-down transistors may be obtained from any suitable control circuit (dynamic or static).

Figure 5:
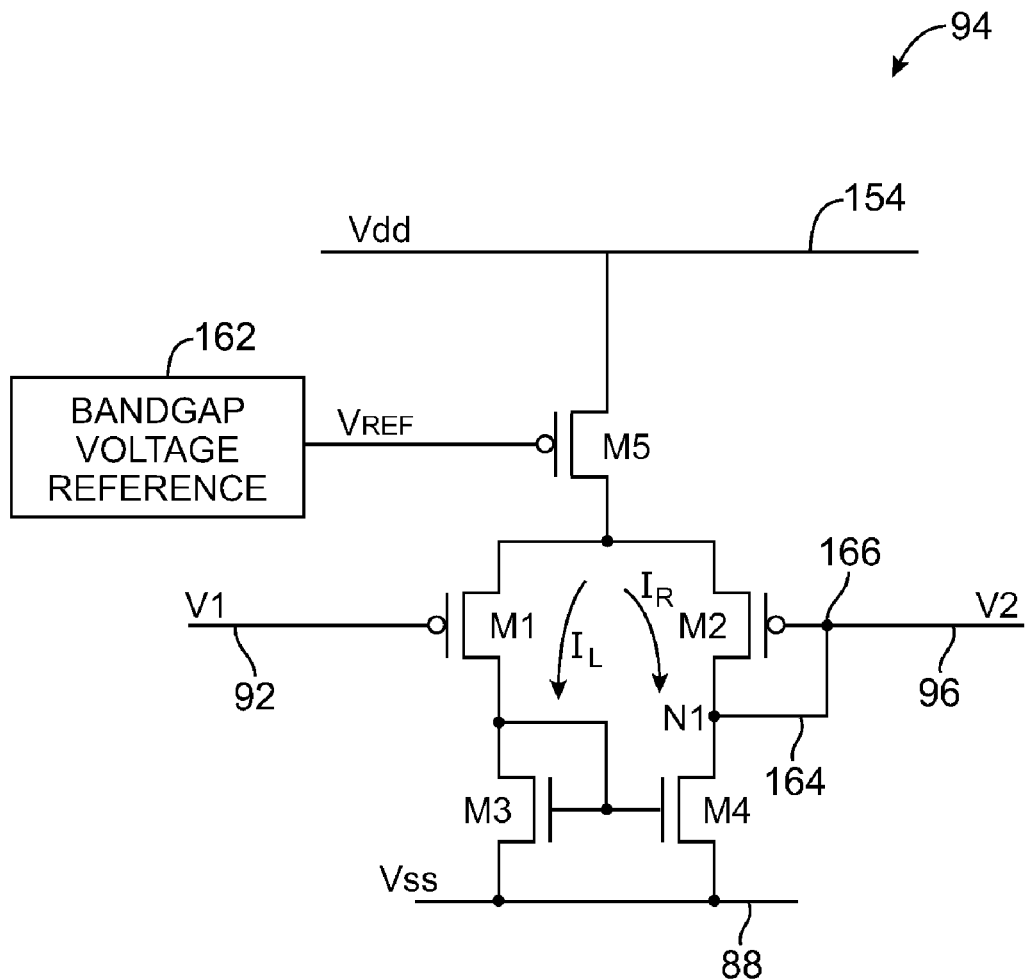
FIG. 5 is a diagram of an illustrative buffer that may be used to feed control signals to multiple parallel-connected voltage-controlled oscillators in a phase-locked loop of the type shown in FIG. 4 in accordance with an embodiment of the present invention.

Illustrative buffer circuitry that may be used for buffer 94 of FIG. 4 is shown in FIG. 5. As shown in FIG. 5, buffer 94 may have a p-channel metal-oxide-semiconductor transistor M5, and p-channel metal-oxide-semiconductor transistors M1 and M2 (which form a differential pair), and n-channel metal-oxide-semiconductor transistors M3 and M4 (which are connected as a current mirror and form an active load). The circuitry of buffer 94 may be powered using positive power supply Vdd on positive power supply line 154 and ground power supply Vss on ground power supply terminal 88. Transistor M5 receives a biasing reference voltage Vref from a voltage reference. The voltage reference that produces the reference voltage Vref may be, for example, a bandgap voltage reference such as bandgap voltage reference 162, or may be a voltage derived from a bandgap reference or through other means of generating bias voltages.

During operation, the voltage V2 on output 96 responds to changes in the voltage V1 on input 92. There may be a non-unitary gain associated with buffer 94 or buffer 94 may have a unitary gain. The strengths of transistors M3 and M4 may be equal when it is desired to produce a unitary gain and may be unequal when it is desired to produce a non-unitary gain. The use of a non-unitary gain will adjust the loop gain of phase-locked loop 70 and should therefore be taken into consideration when implementing circuit 70 for a given application.

In a unity-gain configuration, the voltage V2 tracks the input voltage V1. Consider, as an example, the situation in which the voltage V1 rises slightly. When V1 rises, the current $I_L$ that is flowing through the left-hand side of buffer 94 is decreased by transistor M1. Current source transistor M5 produces a constant current, so when $I_L$ decreases, the magnitude of the current $I_R$ that is flowing through the right-hand side of buffer 94 increases by a corresponding amount. Because of the current mirror properties of the active load, the drain current of transistor M4 is equal to the current $I_L$. Because $I_R$ has increased while the current ($I_L$) through M4 has decreased, there is a voltage increase on node N1. Path 164 conveys this voltage increase to node 166 and therefore to output path 96. As this example demonstrates, voltage increases on input 92 result in corresponding voltage increases on output 96. Similarly, voltage decreases on input 92 result in voltage decreases on output 96. In general, the voltage V2 on output 96 tracks the input voltage V1 on input 92.

Figure 6:
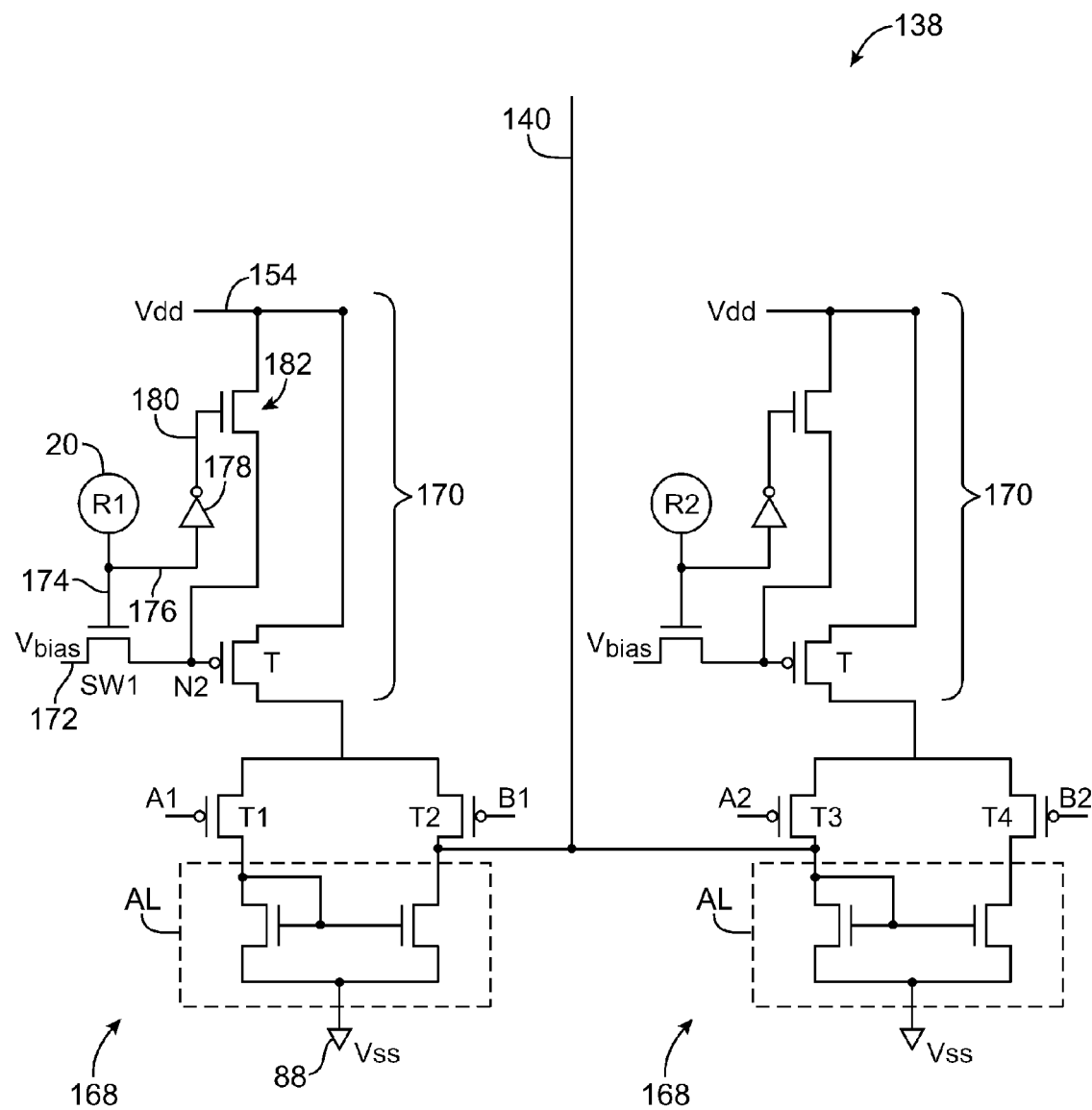
FIG. 6 is a diagram of an illustrative multiplexer that may be used in switching a desired voltage-controlled oscillator into use in a phase-locked loop in accordance with an embodiment of the present invention.

Illustrative circuitry that may be used for multiplexer 138 of FIG. 4 is shown in FIG. 6. Multiplexer 138 may have a number of differential input circuits 168, each with an active load AL and a pair of input transistors. Input circuits 168 may receive differential input signals on inputs A1 and B1 from voltage-controlled oscillator 98 (using transistors T1 and T2) and may receive differential input signals on inputs A2 and B2 from voltage-controlled oscillator 100 (using transistors T3 and T4). In this example, multiplexer 138 is configured to handle inputs from two respective voltage-controlled oscillators. Accordingly, multiplexer 138 of FIG. 6 has two input circuits 168. This is merely illustrative. Any suitable number of input circuits 168 may be used in multiplexer 138 if desired.

When a given input circuit 168 is active, the differential input signals that it receives result in corresponding output signals on multiplexer output 140. To ensure that only one desired input is connected to output 140 at a given time, the undesired inputs are disabled by powering down the input circuits 168 that are associated with those undesired inputs.

Power down operations may be performed using power transistors such as transistor T. A control circuit formed from transistors SW1 and 182 may be used to ensure that transistor T is fully turned off when desired and that no undesired leakage current flows through a disabled multiplexer path. Each transistor T may be controlled by a respective dynamic or static control signal. As shown in the FIG. 6 example, each transistor T may be controlled by a static control signal produced by a corresponding programmable element 20.

The output from programmable element R1 is conveyed to the gate of switch SW1 via path 174. Vbias path 172 may receive a voltage reference from, for example, a bandgap reference or through other means. When the signal on path 174 is low, transistor SW1 will be off and transistor TN will be off. This will power down the associated input circuit 168. When the signal on path 174 is high, transistor SW1 will be turned on and the voltage Vbias will be applied to transistor T. In this situation, current will flow into the associated input circuit 168. That input circuit 168 will therefore be active and will route its input signals to multiplexer output 140.

Transistor 182 serves as a pull-up transistor. When switch SW1 is opened by taking the signal on path 174 low, the low voltage on path 176 will be inverted by inverter 178 to take line 180 high. The high signal on line 180 and the gate of transistor 182 will turn on transistor 182. This, in turn, will connect node N2 to positive power supply line 154. When node N2 is connected to power supply line 154, the gate of transistor T will be pulled high and transistor T will be fully turned off. Because transistor T is fully off, no undesired leakage currents will flow through transistor T into the disabled input circuit 168.

If desired, one or more of the voltage-controlled oscillators in phase-locked loop circuit 70 may be implemented using an external chip. With this type of arrangement, high-frequency circuitry or other specialized circuitry may be used for the external voltage oscillator circuitry. In some situations, circuitry of this type might be difficult or impossible to implement using the resources available on the integrated circuit that contains the reminder of phase-locked loop circuit 70. As an example, high-frequency voltage-controlled oscillators may be implemented using external integrated circuits that contain bipolar transistors, whereas the phase-frequency detector, charge pump, loop filter, and other portions of phase-locked loop circuit 70 may be implemented using a complementary metal-oxide-semiconductor (CMOS) transistor integrated circuit.

Figure 7:
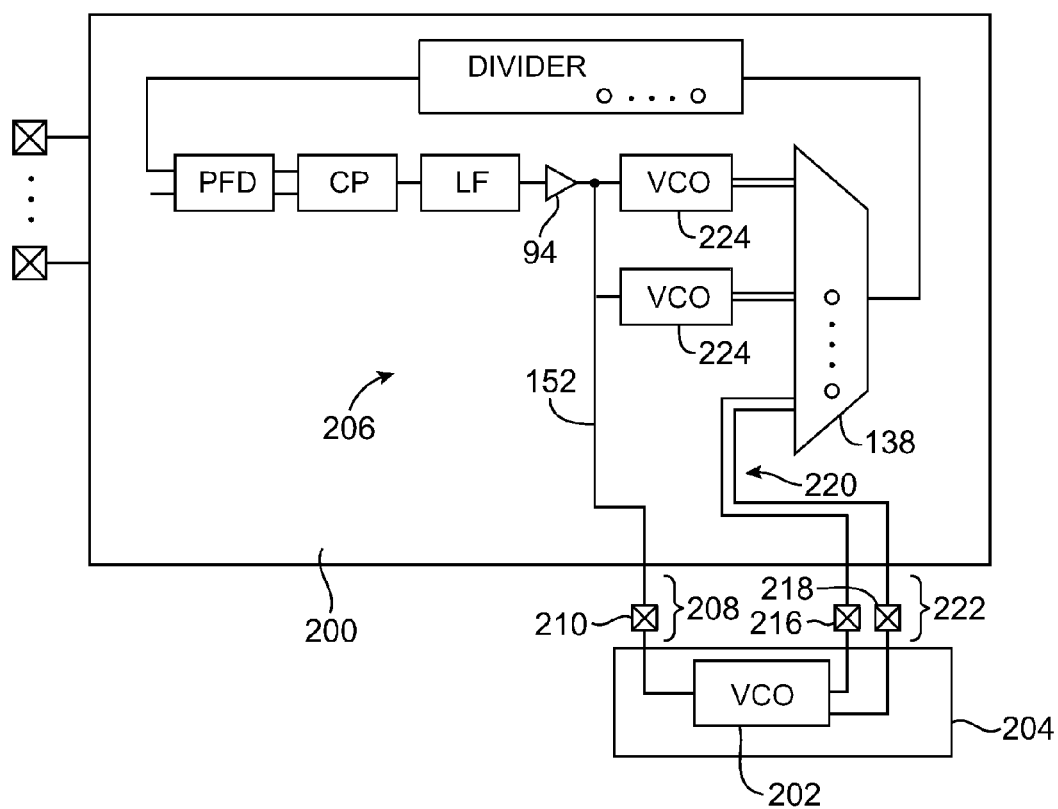
FIG. 7 is a diagram of an illustrative system in which one or more voltage-controlled oscillators for an adjustable phase-locked loop are provided using an external integrated circuit in accordance with an embodiment of the present invention.

As shown in FIG. 7, with an external voltage-controlled oscillator scheme, signals from the phase-locked loop circuitry 206 on first integrated circuit 200 may be routed to voltage-controlled oscillator circuitry 202 on second integrated circuit 204 via input-output pins 210, 216, and 218. Input-output pins 210, 216, and 218 may be any suitable input-output connectors, such as solder bumps, contact pads, wire bonds, combinations of these electrical connectors, etc.

Input-output pins 210, 216, and 218 may be included in paths 208 and 222. Path 208 may serve as an output path that routes signals from integrated circuit 200 to integrated circuit 204. Path 222 may serve as a differential input path that routes signals from integrated circuit 204 to integrated circuit 200. Pins 218 and 216 may be used as part of the conductive paths in the pair of conductive lines in path 222. Differential path 222 may be connected to internal differential path 220. Differential path 220 may be used to route signals from voltage-controlled oscillator 202 to an input of multiplexer 138. If desired, a single-ended signaling scheme may be used for paths 222 and 220. As shown in FIG. 7, path 208 may serves as an extension to path 152 in integrated circuit 200. Path 152 may be connected to the output of buffer 94.

In the FIG. 7 example, path 152 is shown as distributing signals to the inputs of two internal voltage-controlled oscillators 224 and one external voltage-controlled oscillator 202. Output signals from each of these voltage-controlled oscillators are then received at the inputs to multiplexer 138. This is merely illustrative. There may be any suitable number of external voltage-controlled oscillators such as voltage-controlled oscillator 202 connected between path 208 and multiplexer 138 (e.g., one, two, three, more than three, etc.) and there may be any suitable number of internal voltage-controlled oscillators 224 connected between path 152 and multiplexer 138 (e.g., none, one, two, three, etc.).

Moreover, each external voltage-controlled oscillator 202 may be provided on a separate external integrated circuit such as integrated circuit 204 or more than one external voltage-controlled oscillator may be implemented on the same external integrated circuit. Configurations with multiple external integrated circuits each of which contains one or more voltage-controlled oscillators such as voltage-controlled oscillator 202 may also be used.

Figure 8:
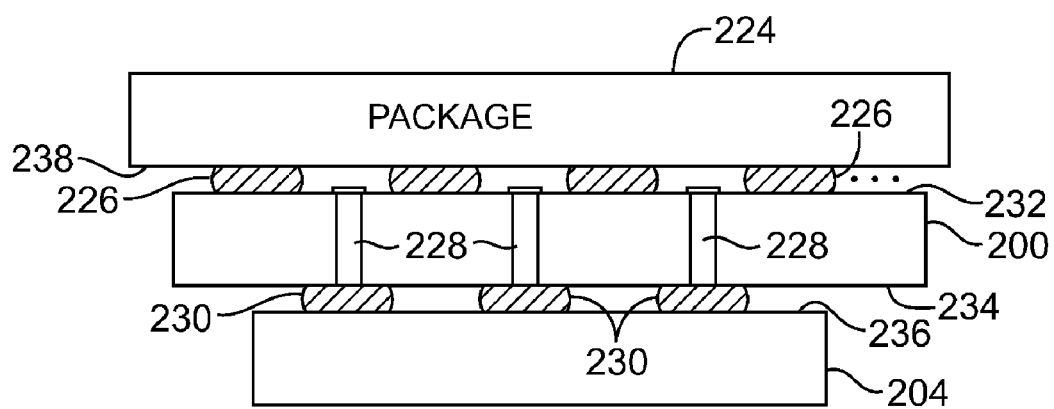
FIG. 8 is a cross-sectional side view of an illustrative system of the type shown in FIG. 7 in accordance with an embodiment of the present invention.

Any suitable packaging scheme may be used to interconnect external voltage-controlled oscillator circuitry with the rest of the phase-locked loop. An illustrative mounting arrangement is shown in FIG. 8. In the example of FIG. 8, integrated circuit 200 has been mounted to surface 238 of package 224 using conventional package-to-silicon bumps 226. Package 224 may contain internal routing lines and pads for forming connections with external structures such as external printed circuit board structures. Contact pads may be formed on surface 238 of package 224 and on top surface 232 of integrated circuit 200. Bumps 226 may form electrical contacts between these corresponding contact pads. There may be any suitable number of bumps 226 (e.g., tens, hundreds, etc.). The bumps may be formed in an array.

A similar scheme may be used to interconnect integrated circuit 204 with integrated circuit 200. In particular, bumps 230 may be used to form electrical connections between contact pads on lower integrated circuit surface 234 of integrated circuit 200 and upper integrated circuit surface 236 of integrated circuit 204. Bumps 230 of FIG. 8 may serve as input-output pins 210, 216, and 218 of FIG. 7. The phase-locked loop circuitry and other circuitry of integrated circuit 200 may be formed on upper surface 232. Through-silicon vias such as vias 228 may be used to route signals from the circuitry of integrated circuit 200 to solder bumps 230. Vias 228 may be formed using wet etching, dry etching, or any other suitable fabrication technique. Metal or other suitable conductive material may be formed within the vias 228 to form electrical contact between the phase-locked loop circuitry of integrated circuit 200 and the voltage-controlled oscillator circuitry of integrated circuit 204.

The foregoing is merely illustrative of the principles of this invention and various modifications can be made by those skilled in the art without departing from the scope and spirit of the invention.

What is claimed is:

1. Circuitry, comprising:
   a plurality of voltage-controlled oscillators having respective control inputs operable to receive a common control signal and having respective voltage-controlled oscillator outputs;
   a plurality of power-down circuits, wherein each power-down circuit is coupled between a power supply terminal and a respective one of the plurality of voltage-controlled oscillators; and
   programmable memory elements operable to receive configuration data and operable to supply control signals, wherein at least one power-down circuit of the plurality of power-down circuits is operable to receive a control signal from one of the programmable memory elements, wherein the control signal is operable to direct the at least one of the power-down circuits to power down the respective one of the plurality of voltage-controlled oscillators.

2. The circuitry defined in claim 1 further comprising:
   a multiplexer having a plurality of multiplexer inputs, each multiplexer input being coupled to a respective one of the voltage-controlled oscillator outputs, wherein at least some of the programmable memory elements are operable to be loaded with configuration data and are operable to supply control signals for the multiplexer.

3. The circuitry defined in claim 2 further comprising a buffer having a buffer output operable to supply the common control signal.

4. The circuitry defined in claim 3 wherein the multiplexer has a multiplexer output and wherein the buffer has a buffer input, the circuitry further comprising:
   phase-locked loop circuitry coupled between the multiplexer output and the buffer input.

5. The circuitry defined in claim 4 wherein the phase-locked loop circuitry includes a phase-frequency detector.

6. The circuitry defined in claim 5 wherein the phase-locked loop circuitry includes a charge pump operable to receive control signals from the phase-frequency detector.

7. The circuitry defined in claim 6 wherein the phase-locked loop circuitry includes a loop filter operable to receive an output current from the charge pump and that has a loop filter output coupled to the buffer input.

8. The circuitry defined in claim 2 further comprising:
   a loop filter; and
   a buffer having a buffer output operable to supply the common control signal and operable to isolate capacitance associated with the plurality of voltage-controlled oscillators from the loop filter.

9. The circuitry defined in claim 1 wherein the at least one of the power-down circuits comprises a transistor and wherein the transistor is operable to form an open circuit to power down the given one of the voltage-controlled oscillators.

10. A method of controlling circuitry that includes a plurality of voltage-controlled oscillators each of which is coupled to the output of a common buffer and each of which has an output operable to feed a respective input of a multiplexer, wherein the multiplexer has a multiplexer output, comprising:
    applying control signals to the multiplexer that direct the multiplexer to route signals from a given one of the respective inputs to the multiplexer output to switch a selected voltage-controlled oscillator of the plurality of voltage-controlled oscillators into use in the circuitry, wherein the common buffer and the multiplexer are contained within a first integrated circuit and wherein at least one of the voltage-controlled oscillators is located on a second integrated circuit that is separate from the first integrated circuit;
    routing signals to the voltage-controlled oscillator on the second integrated circuit from the common buffer on the first integrated circuit; and
    routing signals from the voltage-controlled oscillator on the second integrated circuit to the multiplexer on the first integrated circuit, wherein applying the control signals to the multiplexer comprises applying static control signals to the multiplexer from programmable elements.

11. The method defined in claim 10, further comprising:
    while operating the selected one of the voltage-controlled oscillators in a phase-locked loop, powering down at least one of the voltage-controlled oscillators other than the selected one of the voltage-controlled oscillators to conserve power.

12. The method defined in claim 11 wherein routing the signals to the voltage-controlled oscillator on the second integrated circuit from the common buffer on the first integrated circuit and routing the signals from the voltage-controlled oscillator on the second integrated circuit to the multiplexer on the first integrated circuit comprises routing signals to and from the voltage-controlled oscillator on the second integrated circuit with through-chip vias in the first integrated circuit.

13. The method defined in claim 11 wherein powering down the voltage-controlled oscillator comprises:
    applying a static control signal from a programmable element to a gate of a power-down transistor.

14. The method defined in claim 10 wherein at least one of the voltage-controlled oscillators is located on the first integrated circuit, the method further comprising:

routing signals to the voltage-controlled oscillator on the first integrated circuit from the common buffer on the first integrated circuit; and routing signals from the voltage-controlled oscillator on the first integrated circuit to the multiplexer on the first integrated circuit.

15. A phase-locked loop, comprising:
a phase-frequency detector operable to produce error signals;
a charge pump operable to receive the error signals and operable to produce a corresponding output current;
a loop filter operable to receive the output current and operable to produce a corresponding first voltage signal;
a buffer operable to receive the first voltage signal and operable to produce a corresponding second voltage signal at a buffer output;
a multiplexer having a plurality of multiplexer inputs and having a multiplexer output;
a feedback path operable to provide signals from the multiplexer output to the phase-frequency detector;
a plurality of voltage-controlled oscillators each having an input coupled to the buffer output and each having a voltage-controlled oscillator output operable to provide signals to a respective one of the plurality of multiplexer inputs, wherein the multiplexer inputs each comprise a pair of differential input lines, wherein the multiplexer comprises a plurality of differential input circuits each having a pair of transistors with a pair of corresponding gates, and wherein the pair of gates in each differential input circuit is coupled to a pair of the differential input lines; and
a plurality of power-down circuits each coupled between a power supply voltage terminal and a respective one of the differential input circuits, wherein at least one of the power-down circuits is operable to receive a control signal operable to direct that power-down circuit to power down a given one of the differential input circuits.

16. The phase-locked loop circuit defined in claim 15 wherein the multiplexer comprises a control input operable to receive static control signals from programmable elements, the multiplexer being operable to couple a selected one of the pairs of differential input lines to the multiplexer output in response to the static control signals.

17. The phase-locked loop circuit defined in claim 16 further comprising a plurality of power-down transistors each coupled between a positive power supply voltage terminal and a respective one of the voltage-controlled oscillators, wherein at least one of the power-down transistors is operable to receive a control signal from a programmable element is operable to direct that power-down transistor to form an open circuit to power down a given one of the voltage-controlled oscillators to conserve power.

18. The phase-locked loop circuit defined in claim 15 wherein each of the voltage-controlled oscillators comprises an adjustable capacitor having a control input coupled to the buffer output.

19. The circuitry defined in claim 15 wherein the at least one of the power-down circuits comprises a transistor operable to form an open circuit to power down the given one of the differential input circuits.

20. A phase-locked loop, comprising:
a phase-frequency detector operable to produce error signals;
a charge pump operable to receive the error signals and operable to produce a corresponding output current;
a loop filter operable to receive the output current and operable to produce a corresponding first voltage signal;
a buffer operable to receive the first voltage signal and operable to produce a corresponding second voltage signal at a buffer output;
a multiplexer having a plurality of multiplexer inputs and having a multiplexer output;
a feedback path operable to provide signals from the multiplexer output to the phase-frequency detector;
a plurality of voltage-controlled oscillators each having an input coupled to the buffer output and each having a voltage-controlled oscillator output operable to provide signals to a respective one of the plurality of multiplexer inputs, wherein the buffer comprises a unitary gain buffer having a current source formed from a transistor operable to receive a bandgap reference voltage, and
programmable elements that apply static control signals to the multiplexer inputs.

21. The phase-locked loop circuit defined in claim 20 wherein the unitary gain buffer comprises:
a first p-channel transistor and a first re-channel transistor coupled in series between the transistor operable to receive the bandgap reference voltage and a power supply terminal; and
a second p-channel transistor and a second re-channel transistor coupled in series between the transistor operable to receive the bandgap reference voltage and the power supply terminal.

22. The phase-locked loop circuit defined in claim 21 wherein the gate of the first p-channel transistor is operable to receive the first voltage signal and wherein the unitary gain buffer is operable to produce the second voltage signal at a node between the second p-channel transistor and the second n-channel transistor.

23. The phase-locked loop circuit defined in claim 22 wherein the gates of the first and second n-channel transistors are coupled to a node between the first p-channel transistor and the first n-channel transistor.

* * * * *